United States Patent
Busse et al.

(10) Patent No.: US 6,462,545 B1
(45) Date of Patent: Oct. 8, 2002

(54) PREPARATION SEQUENCE FOR GRADIENT ECHO MRI ACQUISITION

(75) Inventors: Reed F. Busse, Rochester, MN (US); Stephen J. Riederer, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 09/717,179

(22) Filed: Nov. 20, 2000

(51) Int. Cl.⁷ .................................................. G01V 3/00
(52) U.S. Cl. ........................................ 324/309; 324/306
(58) Field of Search ................................. 324/300, 306, 324/307, 309, 312, 314

(56) References Cited

U.S. PATENT DOCUMENTS

| | | | | |
|---|---|---|---|---|
| 4,733,186 A | * | 3/1988 | Oppelt et al. | 324/309 |
| 5,245,282 A | | 9/1993 | Mugler, III et al. | 324/309 |
| 5,420,510 A | * | 5/1995 | Fairbanks et al. | 324/300 |
| 5,541,514 A | * | 7/1996 | Heid et al. | 324/309 |
| 5,908,386 A | | 6/1999 | Ugurbil et al. | 600/410 |

\* cited by examiner

*Primary Examiner*—Louis Arana
(74) *Attorney, Agent, or Firm*—Quarles & Brady, LLP

(57) ABSTRACT

An image acquisition using a spoiled, gradient-recalled echo imaging pulse sequence is preceded by a magnetization preparation sequence which rapidly drives longitudinal magnetization to the steady-state equilibrium level established by the imaging pulse sequence. The preparation sequence includes an RF saturation pulse followed by a recovery period ($T_{rec}$) whose length is determined by the scan parameters of the imaging pulse sequence.

7 Claims, 3 Drawing Sheets

PREPARATION SEQUENCE FOR GRADIENT ECHO MRI ACQUISITION

GOVERNMENT LICENSE RIGHTS

The U.S. Government has a paid-up license in this invention and the right in limited circumstances to require the patent owner to license others on reasonable terms as provided for by the terms of CA37993 awarded by the National Institutes of Health.

BACKGROUND OF THE INVENTION

The field of the invention is nuclear magnetic resonance imaging methods and systems. More particularly, the invention relates to the acquisition of NMR data using rapid gradient echo pulse sequences such as spoiled gradient echo sequences.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$, is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. Whereas the more conventional pulse sequences have repetition times TR which are much greater than the spin-spin relaxation constant $T_2$ so that the transverse magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precession (SSFP) techniques or "snapshot" techniques. One such pulse sequence is spoiled, gradient-recalled echo pulse sequence.

While some "snapshot" techniques purposefully acquire data when he magnetization is in a transient state, data acquisition during steady state is often preferred in order to avoid blurring and image artifacts caused by fluctuating view-to-view NMR signal levels.

The standard method for assuring that magnetization has achieved steady-state prior to data collection is to repeat the imaging pulse sequence many times without acquisition of the NMR signals. As many as 200 of these so-called "dummy repetitions" or "disdaqs" may be required to drive the magnetization into a steady-state condition for some pulse sequences.

While the few extra seconds wasted prior to data acquisition are inconsequential for many common clinical applications, several applications would be significantly improved if this time could be reduced. Three such applications are: (1) real-time interactive imaging, where changing the excited slice disturbs magnetization equilibrium; (2) ECG-triggered cine imaging, where pausing the sequence between heartbeats disturbs magnetization equilibrium; and (3) centrically acquired angiography sequences where acquisition timing with respect to contrast arrival may be critical.

SUMMARY OF THE INVENTION

The present invention is a preparatory pulse sequence for an MRI system which rapidly drives magnetization to a prescribed steady-state level prior to the acquisition of NMR data using a snapshot imaging pulse sequence. More particularly, the preparatory pulse sequence includes applying an RF pulse which tips the longitudinal magnetization of spins being imaged by a flip angle β; waiting for the magnetization to recover to a prescribed level during a recovery interval $T_{rec}$; and then acquiring NMR data using a prescribed snapshot imaging pulse sequence.

A general object of the invention is to rapidly drive spin magnetization to the steady-state level for a prescribed snapshot image cquisition. By applying an RF pulse to the spins, their longitudinal magnetization is quickly driven below the desired steady-state level and begins to rapidly recover at a rate determined by the spin relaxation time $T_1$. The recovery interval $T_{rec}$ is selected such that this spin magnetization recovers to the steady-state level as the data acquisition is begun using the prescribed snapshot imaging pulse sequence

DESCRIPTION OF THE PREFERRED EMBODIMENT

Figure 1:
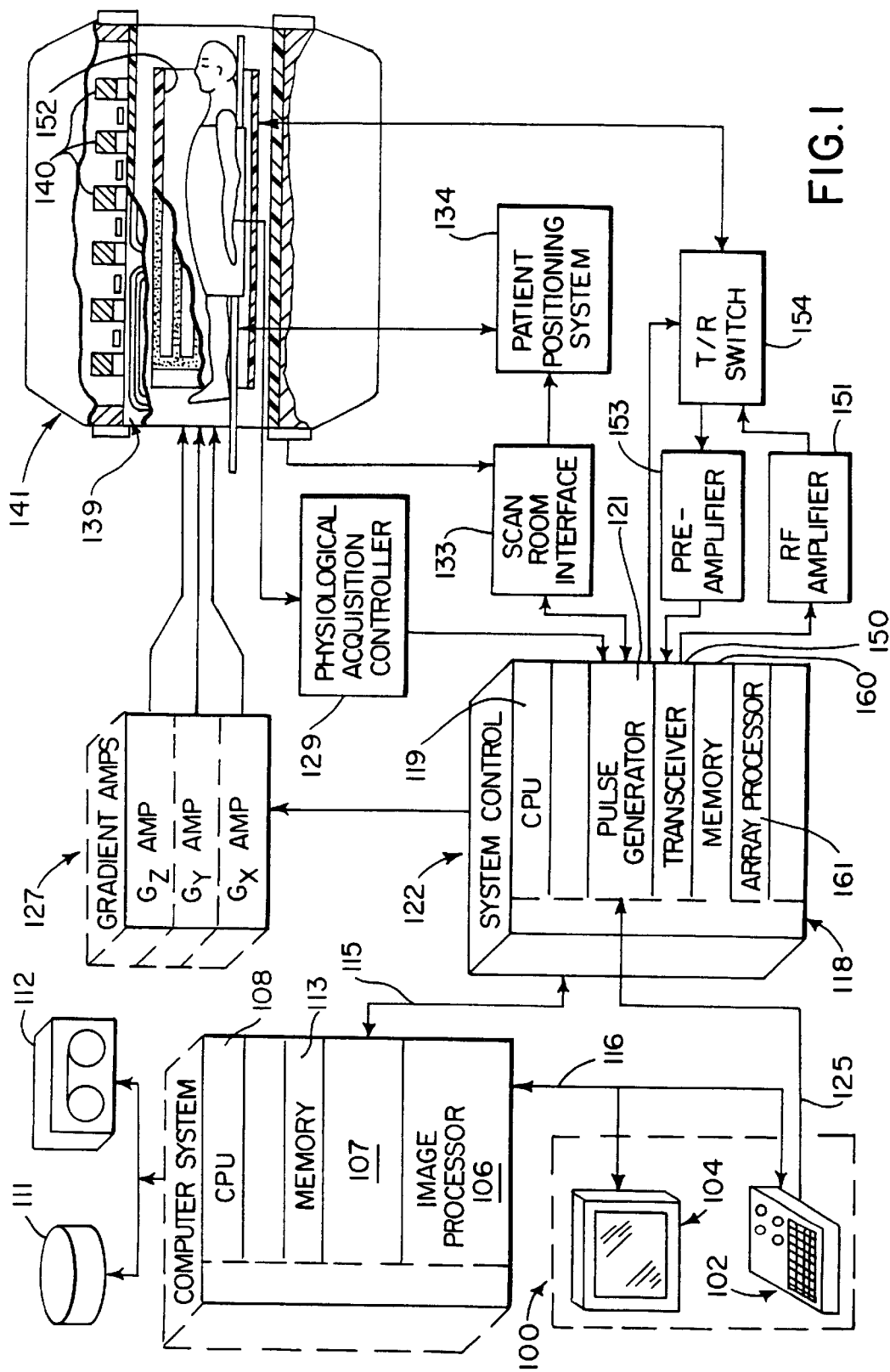
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

Figure 2:
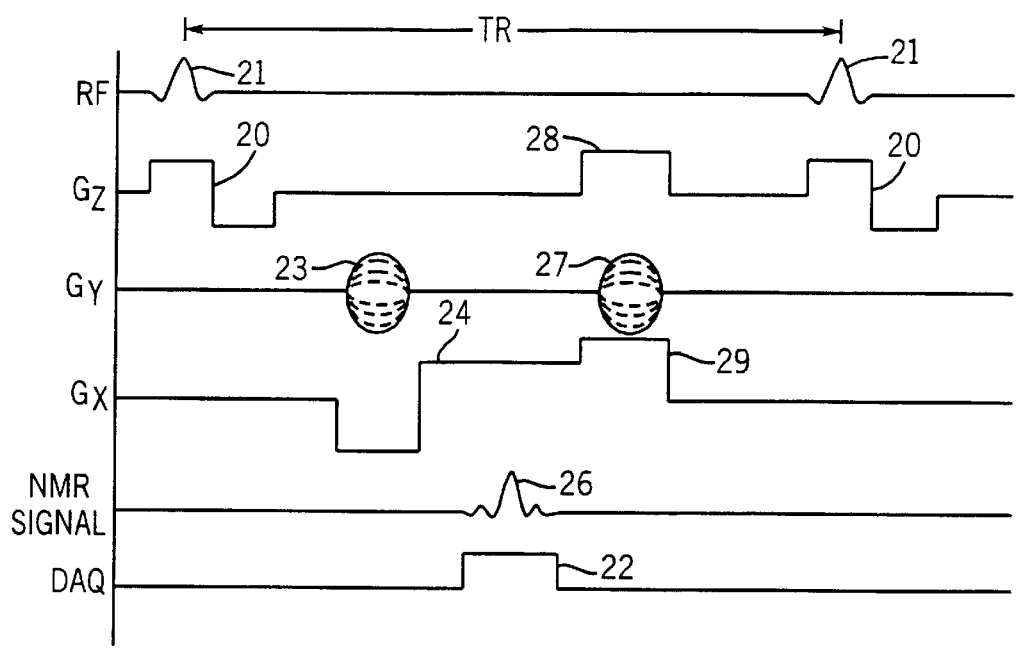
FIG. 2 is a graphic representation of an exemplary snapshot imaging pulse sequence which may be used on the MRI system of FIG. 1 to acquire NMR image data.

The MRI system of FIG. 1 performs a series of pulse sequences to collect sufficient NMR data to reconstruct an image. Referring particularly to FIG. 2, an exemplary snapshot imaging pulse sequence is shown. This is a spoiled, gradient-recalled echo pulse sequence in which a small flip-angle RF excitation pulse 21 is produced in the presence of a slice select gradient 20 and an NMR signal 26 is acquired during a data acquisition window 22 in the presence of a readout gradient 24. The pulse sequence is repeated at intervals TR and a phase encoding gradient 23 is stepped through a set of values to acquire a complete sampling of k-space from which an image is reconstructed.

A characteristic of this pulse sequence is that a relatively small flip angle $\alpha$ (e.g. 20° to 45°) is produced by the RF excitation pulse 21 and the repetition interval TR is very short (e.g. 4 ms to 12 ms). Because TR is less than the spin relaxation time $T_2$, transverse magnetization remains at the end of the pulse sequence. Three measures are taken to insure this remaining transverse magnetization does not corrupt the NMR signal acquired during the next pulse sequence. First, the phase encoding is "rewound" by applying a rewinder gradient pulse 27 along the $G_y$ phase encoding axis. The rewinder gradient pulse 27 is the same as the phase encoding pulse 23, but it has the opposite polarity. The second measure is the application of spoiler gradient pulses 28 and 29 along the respective $G_z$ slice select axis and $G_x$ readout axis. These spoiler gradients 28 and 29 dephase any remaining transverse magnetization such that it does not produce any net signal in subsequent signal readout. Third, the phase of the applied RF pulse 21 is incremented an amount $\Delta\phi$ for each successive pulse sequence.

Figure 3:
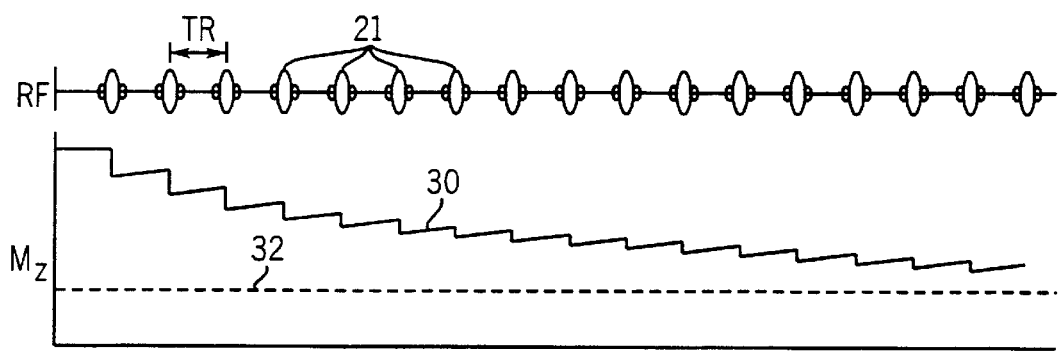
FIG. 3 is a graphic representation of a transient phase of a scan using the pulse sequence of FIG. 2 to drive the magnetization to a steady-state condition.

When snapshot pulse sequences such as the pulse sequence of FIG. 2 are employed during a scan, the standard practice is to repeatedly perform the pulse sequence at the beginning of the scan to drive the magnetization to a steady-state level. This level is determined by the pulse sequence scan parameters such as rf pulse flip angle ($\alpha$) and transmit repeat time (TR). As shown in FIG. 3, as the RF pulse 21 is applied during each repetition of the pulse sequence, the longitudinal magnetization ($M_z$) is incrementally decreased as indicated by graph 30. The longitudinal magnetization $M_z$ will eventually reach a steady-state level indicated by dotted line 32, but it may require 100 to 200 repetitions at intervals TR for this to occur. Until steady-state equilibrium is reached, it is customary in the art to turn off the analog-to-digital converter such that no NMR signal is acquired during the DAQ window 22. The scan is, therefore, lengthened by the time needed to transgress this transient-state of the longitudinal magnetization.

Figure 4:
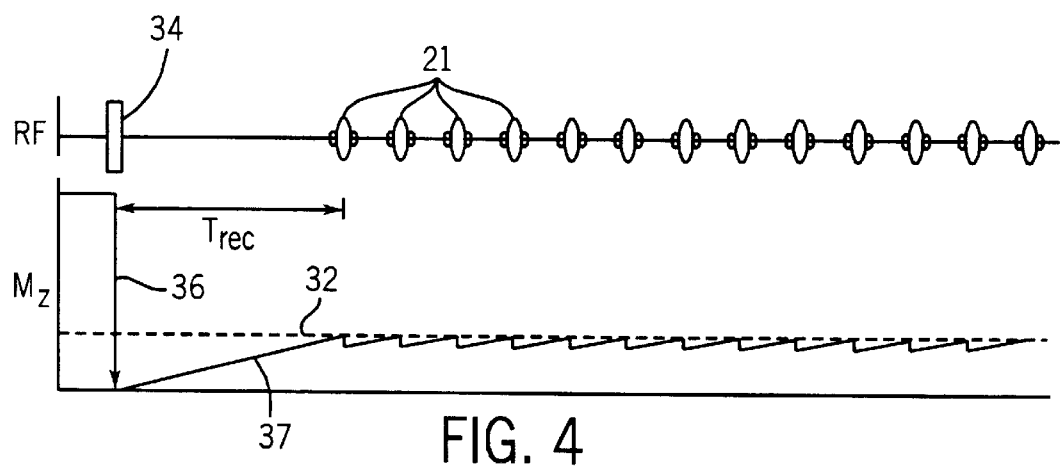
FIG. 4 is a graphic representation of the transient phase of a scan using the preparatory pulse sequence of the present invention prior to data acquisition with the pulse sequence of FIG. 2.

The discovery of the present invention is that the time required to reach the steady-state condition can be considerably reduced by executing a saturation recovery preparation sequence prior to the acquisition of NMR data with a snapshot imaging pulse sequence. Referring to FIG. 4, an RF saturation pulse 34 having a flip angle $\beta$ is applied to substantially suppress the longitudinal magnetization $M_z$ of the spins being imaged as indicated at 36. The longitudinal magnetization will immediately begin to recover as indicated at 37 at a rate determined by the spin relaxation rate $T_1$. After a short recovery period $T_{rec}$ the longitudinal magnetization will reach the steady-state level 32. The data acquisition may then begin using the pulse sequence of FIG. 2 with the prescribed flip angle a and transmit repeat period TR.

In steady-state, the level of the longitudinal magnetization ($M_z$) just before each RF pulse 21 is given by:

$$M_z(ss) = \frac{M_0(1 - e^{-TR/T_1})}{1 - e^{-TR/T_1}\alpha}. \quad (1)$$

When using the preparation RF pulse 34, the longitudinal magnetization just before the first imaging pulse 21 is given by:

$$M_z(t_{rec}) = M_0(1 - e^{-T_{rec}/T_1}) + M_0 \cos\beta e^{-T_{rec}/T_1}. \quad (2)$$

By equating these two expressions, we may solve for the recovery time $T_{rec}$ which places $M_z$ immediately in dynamic equilibrium:

$$T_{rec} = T_1 \ln\frac{(e^{TR/T_1} - \cos\alpha)(1 - \cos\beta)}{1 - \cos\alpha}. \quad (3)$$

This expression is, of course, dependent not only on operator controlled scan parameters α, β and TR, but on the spin relaxation time $T_1$. Ideally, the expression should be $T_1$-independent, placing all tissues simultaneously into steady-state. Since this is not the case, the question becomes—is there a beta for which $T_{rec}$ is nearly independent of $T_1$?

Figure 5:
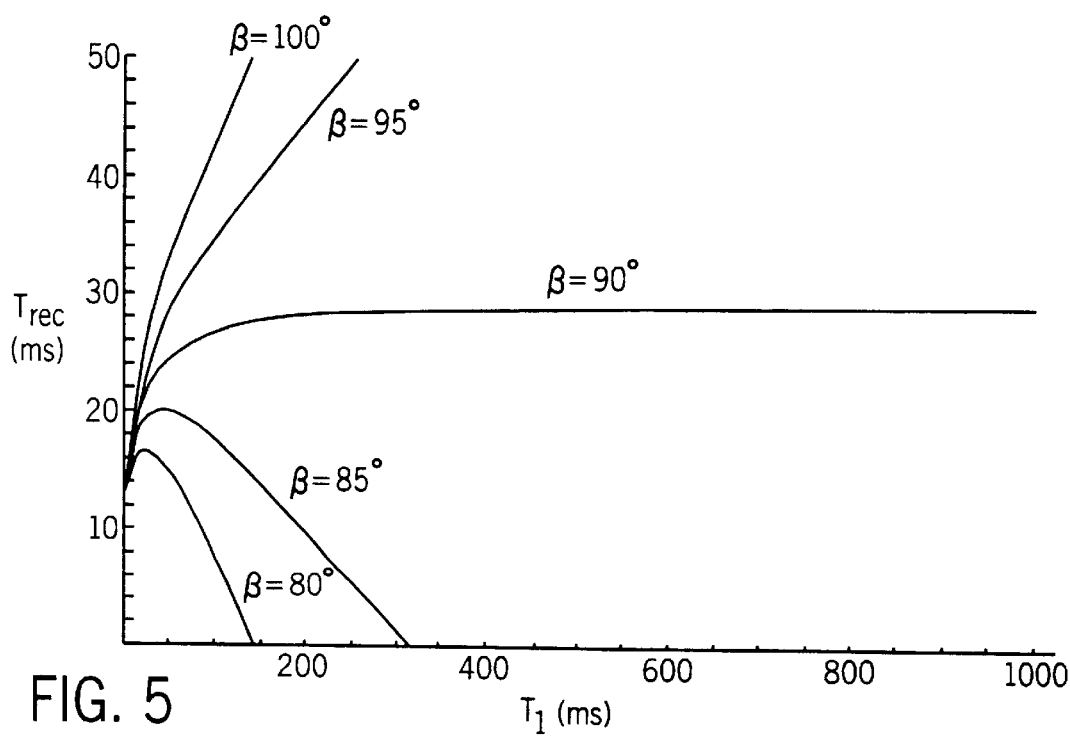
FIG. 5 is a graphic representation showing the recovery time $T_{rec}$ as a function of $T_1$ spin relaxation time for preparatory RF pulses with different flip angles β.

The answer is "yes" for the spoiled, gradient-recalled echo pulse sequence of FIG. 2. FIG. 5 shows the results of measurements of $T_{rec}$ as a function of $T_1$ for α=40°, TR=7 ms, and various flip angles β for the RF saturation pulse 34.

It has been discovered that a 90° saturation pulse does indeed meet the requirement of near $T_1$, independence. For β=90°, we have $$T_{rec} = T_1 \ln\frac{e^{TR/T} - \cos\alpha}{1 - \cos\alpha}. \quad (4)$$

Furthermore, in the limit of $T_1 \to \infty$, then $$T_{rec} = \frac{TR}{1 - \cos\alpha}. \quad (5)$$

To summarize, a saturation pulse (with flip angle β=90°) followed by a recovery period, denoted $T_{rec}$ and given by Eq. 5, places the longitudinal magnetization $M_z$ of all spins very close to the steady-state level 32 prior to imaging. In typical applications of the invention, transient-state time intervals of 500 ms to 1500 ms are reduced to recovery periods ($T_{rec}$) of 20 ms to 50 ms.

Due to imperfect transverse spoiling, when centric view encoding is employed it may be desirable to use a limited number (15 or less) of dummy repetitions following this preparation method. The net time to achieve steady-state, including $T_{rec}$ and the playout of a few dummy repetitions, is far less than if dummy repetitions alone are used.

The RF saturation pulse 34 may be non-selective or selective depending on the particular application. The important factor is that all spins which produce signals for the acquired image be subjected to substantially the same flip angle β.

What is claimed is:

1. A method for acquiring image data with a magnetic resonance imaging system using an imaging pulse sequence that establishes a steady-state level of longitudinal magnetization in spins being imaged, the steps comprising:

applying an RF saturation pulse to the spins to drive their longitudinal magnetization to a level below the steady-state level;

delaying the acquisition of image data for a recovery period $T_{rec}$ having a duration determined by a flip angle (α) of an RF excitation pulse in the imaging pulse sequence and a transmit repeat period (TR) of the imaging pulse sequence during which recovery period $T_{rec}$ the longitudinal magnetization of the spins recovers to substantially the steady-state level; and acquiring image data using the imaging pulse sequence.

2. The method as recited in claim 1 in which the RF saturation pulse produces a flip angle of substantially 90° in the spin magnetization.

3. The method as recited in claim 2 in which the imaging pulse sequence is a spoiled, gradient-recalled echo pulse sequence.

4. The method as recited in claim 3 in which the length of the recovery period $T_{rec}$ is determined by the expression:

$$T_{rec} = \frac{TR}{1 - \cos\alpha}$$

where α is the flip angle of an RF excitation pulse applied during each imaging pulse sequence and TR is the transmit repeat period (TR) of the imaging pulse sequence.

5. A method for acquiring image data with a magnetic resonance imaging system, the steps comprising:

a) producing an RF excitation pulse having a flip angle (α);

b) producing a slice select magnetic field gradient pulse;

c) producing a phase encoding magnetic field gradient pulse;

d) producing a readout magnetic field gradient pulse;

e) acquiring an NMR signal during the production of the readout magnetic field gradient pulse;

f) producing a spoiler magnetic field gradient pulse after acquiring the NMR signal;

g) repeating steps a)–f) a plurality of times with a transmit repeat period (TR) less than a spin relaxation time $T_2$, and in which a different phase encoding magnetic field gradient pulse value is employed during each repeat; and h) applying an RF saturation pulse before step a) is performed and delaying the performance of step a) for a recovery period $T_{rec}$ having a duration determined by the flip angle (α) and the transmit repeat period (TR).

6. The method as recited in claim 5 in which the RF saturation pulse produces a flip angle of substantially 90°.

7. The method as recited in claim 5 in which the length of the recovery period $T_{rec}$ is determined by the expression:

$$T_{rec} = \frac{TR}{1 - \cos\alpha}$$

where α is the flip angle of the RF excitation pulse applied during step a) and TR is the transmit repeat period (TR) of the imaging pulse sequence.

* * * * *